(12) United States Patent
Chen et al.

(10) Patent No.: US 11,901,176 B2
(45) Date of Patent: Feb. 13, 2024

(54) SEMICONDUCTOR ARRANGEMENT AND METHOD FOR MAKING

(71) Applicant: TAIWAN SEMICONDUCTOR MANUFACTURING COMPANY LIMITED, Hsin-Chu (TW)

(72) Inventors: Yi-Shan Chen, Tainan (TW); Hao-Heng Liu, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 18/111,792

(22) Filed: Feb. 20, 2023

(65) Prior Publication Data

US 2023/0197439 A1 Jun. 22, 2023

Related U.S. Application Data

(63) Continuation of application No. 16/689,154, filed on Nov. 20, 2019, now Pat. No. 11,587,782.

(60) Provisional application No. 62/773,335, filed on Nov. 30, 2018.

(51) Int. Cl.
*H01L 21/02* (2006.01)
*H01L 21/033* (2006.01)

(52) U.S. Cl.
CPC ...... *H01L 21/0217* (2013.01); *H01L 21/0332* (2013.01)

(58) Field of Classification Search
CPC ............. H01L 21/0217; H01L 21/0332; H01L 21/76816; H01L 21/76895; H01L 29/785; H01L 27/11; H01L 21/31144; H01L 21/3065; H01L 21/3081; H01L 21/31116; H01L 21/0274
USPC ......................................................... 438/791
See application file for complete search history.

(56) References Cited

U.S. PATENT DOCUMENTS

| | | | |
|---|---|---|---|
| 9,576,954 B1 * | 2/2017 | Greene | H01L 21/823418 |
| 10,121,882 B1 * | 11/2018 | Ho | H01L 23/53238 |
| 2005/0191852 A1 * | 9/2005 | Takigawa | H01L 21/022 257/E21.252 |
| 2014/0099779 A1 | 4/2014 | Chang et al. | |
| 2014/0113438 A1 * | 4/2014 | Usami | H01L 21/76813 438/488 |
| 2015/0126042 A1 * | 5/2015 | Pasquale | H01L 21/31144 438/761 |
| 2015/0162205 A1 * | 6/2015 | Wu | H01L 21/0214 438/618 |
| 2015/0303291 A1 * | 10/2015 | Makiyama | H01L 21/0332 438/172 |
| 2016/0027659 A1 * | 1/2016 | Hong | H01L 21/02164 257/774 |
| 2018/0096846 A1 * | 4/2018 | Arnold | H01L 21/30621 |

(Continued)

*Primary Examiner* — Sheikh Maruf
(74) *Attorney, Agent, or Firm* — COOPER LEGAL GROUP, LLC

(57) ABSTRACT

A method for fabricating a semiconductor arrangement is provided. The method includes forming a first dielectric layer and forming a first semiconductive layer over the first dielectric layer. The first semiconductive layer is patterned to form a patterned first semiconductive layer. The first dielectric layer is patterned using the patterned first semiconductive layer to form a patterned first dielectric layer. A second semiconductive layer is formed over the patterned first dielectric layer and the patterned first semiconductive layer.

20 Claims, 15 Drawing Sheets

(56) References Cited

U.S. PATENT DOCUMENTS

| | | | |
|---|---|---|---|
| 2019/0096692 A1* | 3/2019 | Bei | H01L 21/31138 |
| 2019/0115206 A1* | 4/2019 | Kim | H01L 21/0332 |
| 2019/0148147 A1* | 5/2019 | Huang | H01L 21/0274 |
| | | | 438/703 |
| 2019/0164774 A1* | 5/2019 | Lee | H01L 21/0332 |

* cited by examiner

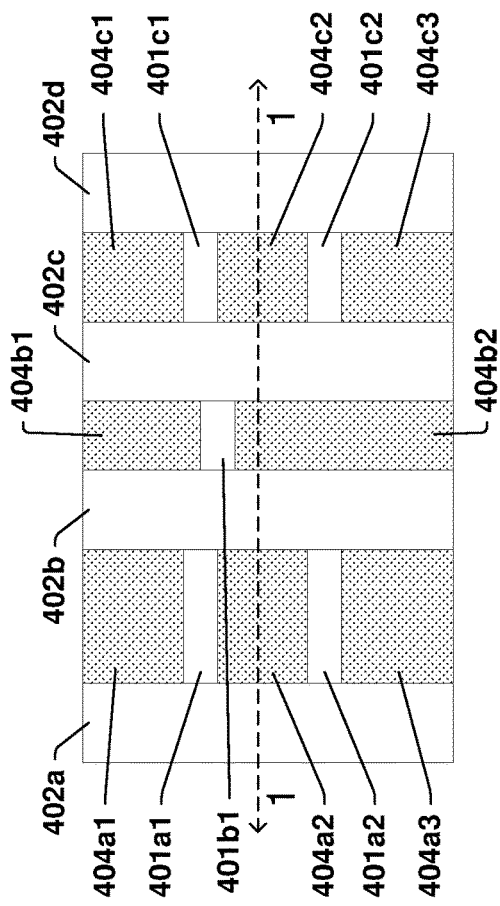
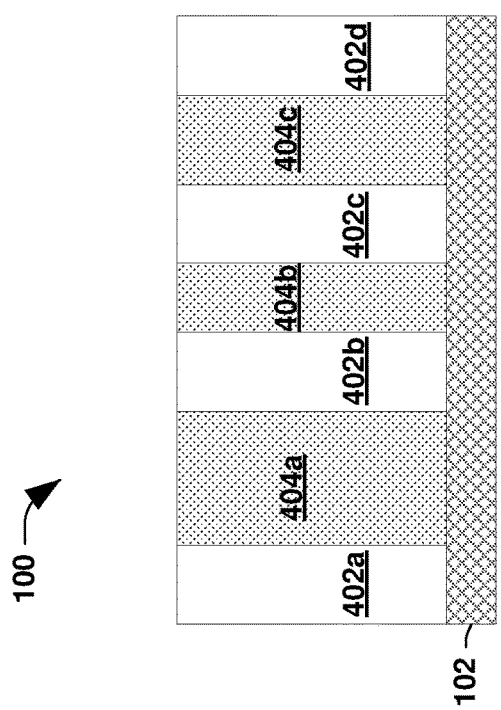
FIG. 1B
FIG. 1A

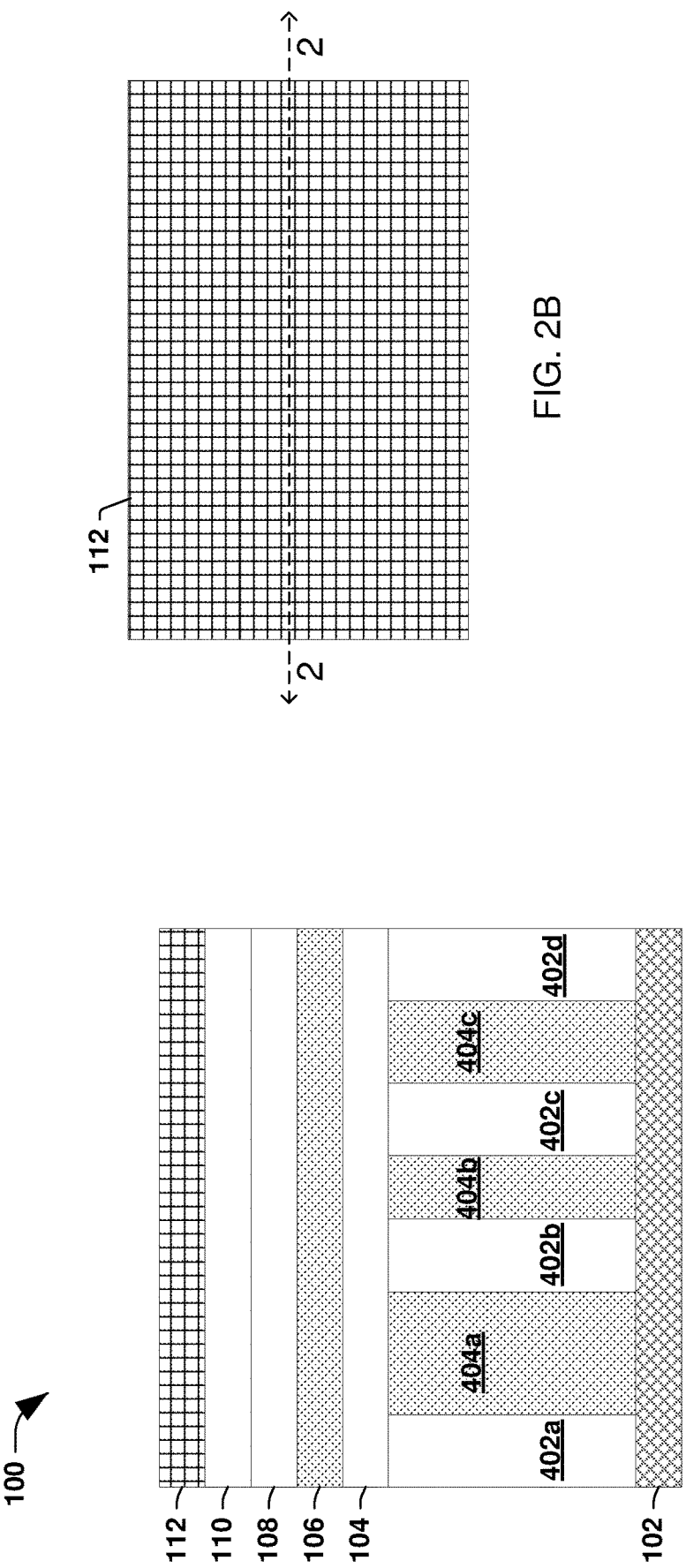

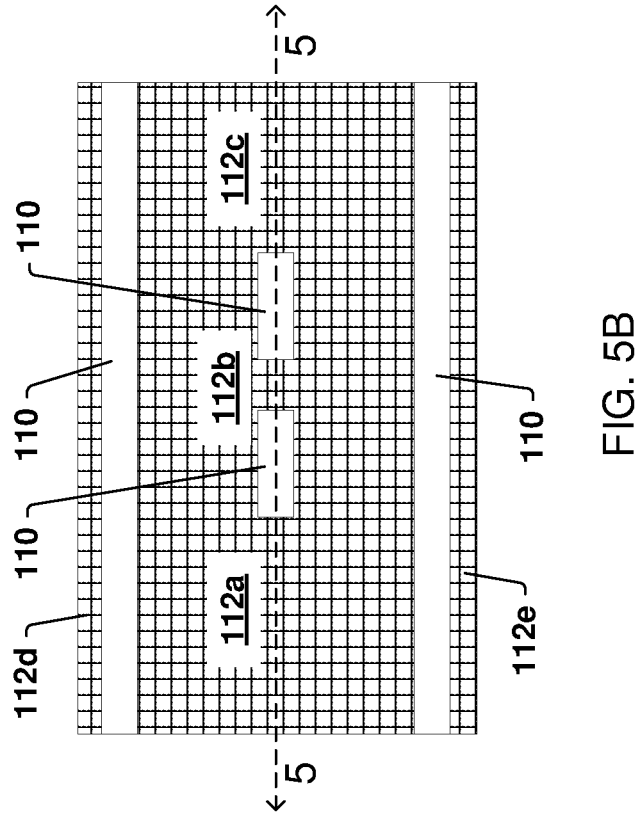
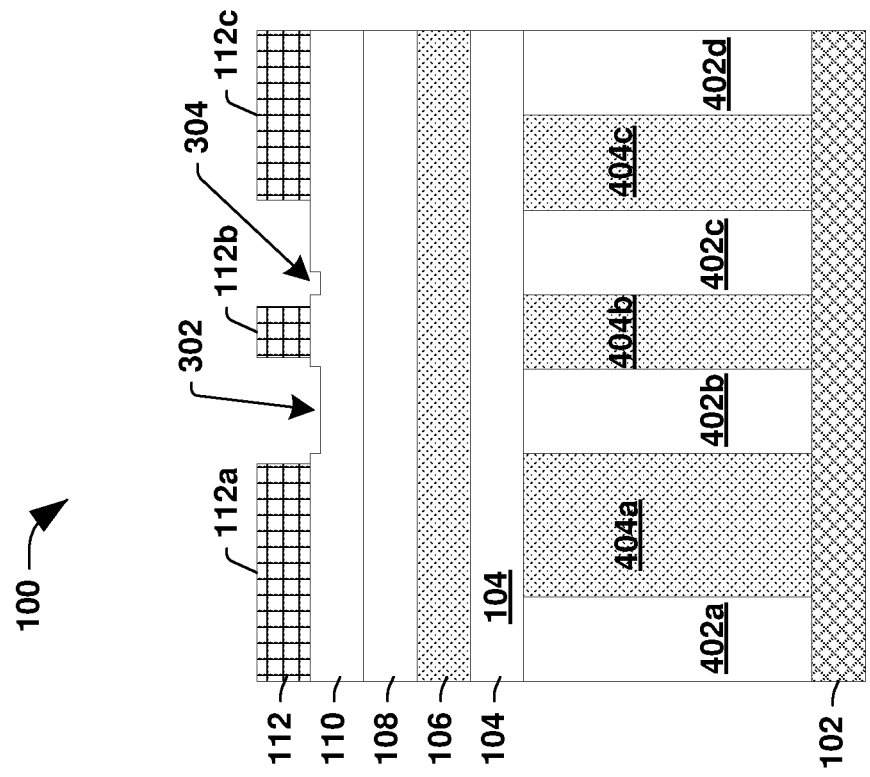
FIG. 5A
FIG. 5B

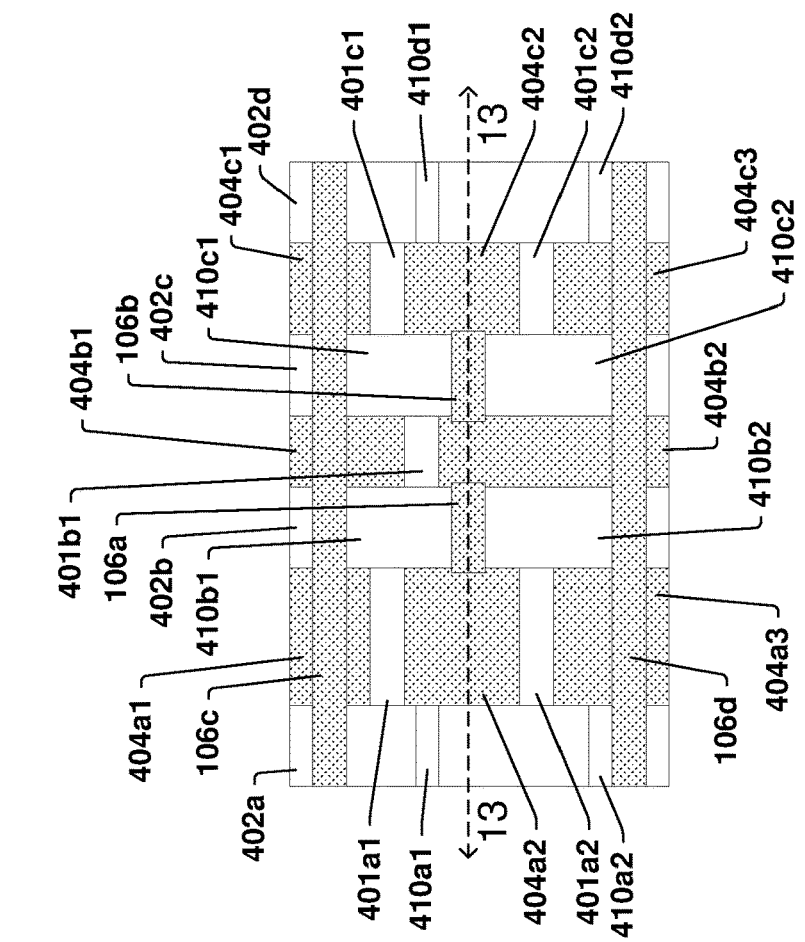
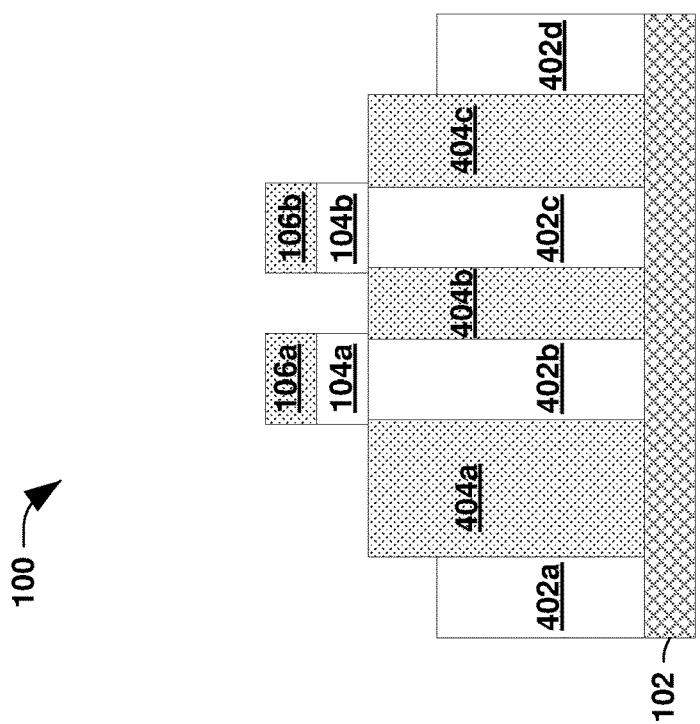
FIG. 13B
FIG. 13A

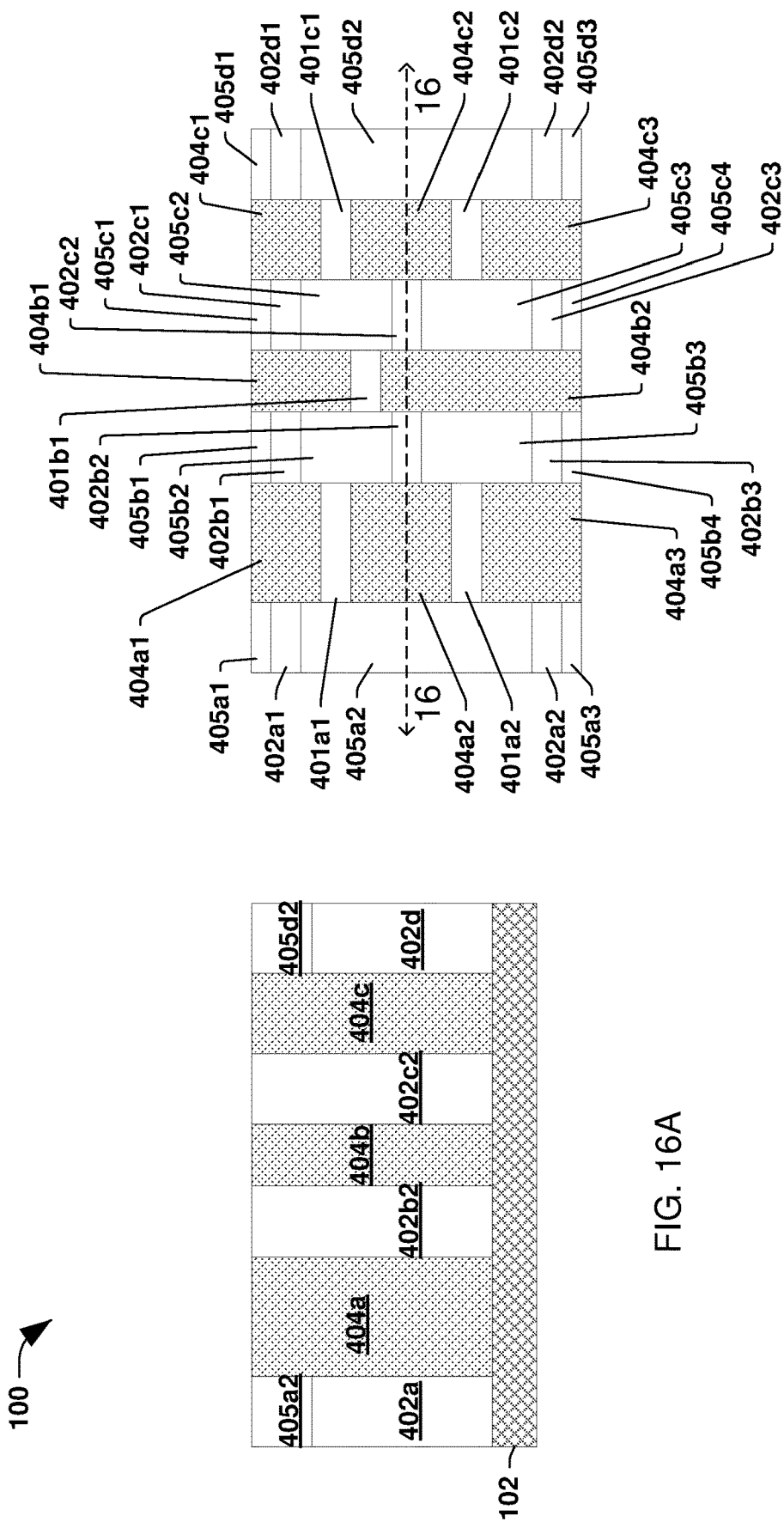

SEMICONDUCTOR ARRANGEMENT AND METHOD FOR MAKING

RELATED APPLICATION(S)

This application is a continuation of U.S. Non-Provisional application Ser. No. 16/689,154, titled "SEMICONDUCTOR ARRANGEMENT AND METHOD FOR MAKING" and filed on Nov. 20, 2019, which claims priority to U.S. Provisional Application 62/773,335, titled "DIELECTRIC PATTERNING METHOD USING A SEMICONDUCTIVE HARD MASK" and filed on Nov. 30, 2018. U.S. Non-Provisional application Ser. No. 16/689,154 and U.S. Provisional Application 62/773,335 are incorporated herein by reference.

BACKGROUND

During semiconductor fabrication, different techniques are used to remove layers or portions of layers used in the building of semiconductor arrangements. One technique to remove layers or portions of layers is etching. Etching is a process where an etchant, such as a liquid chemical, is applied to a layer or a portion of the layer that is to be removed. The layer or portion of the layer is often removed to expose underlying layers or features, or to define a particular pattern in the layer. The layer or portion of the layer to which the etchant is applied has a particular etch selectivity relative to the etchant such that the layer or portion of the layer is removed or etched away by the etchant. Other portions of the layer that are not to be removed are generally covered by a photoresist or hard mask that is not susceptible to the etchant or is susceptible to the etchant to a lesser degree. The portions of the layer that are not to be removed are thus protected from the etchant by the photoresist or hard mask. Once the layer or portion of the layer is etched away, the photoresist or hard mask is removed to reveal the patterned layer or remaining portions of the layer that were not etched away by the etchant.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the dimensions of the various features may be arbitrarily increased or reduced for clarity of discussion.

FIG. 1A is a cross sectional illustration of a semiconductor arrangement at a stage of fabrication, in accordance with one or more embodiments.

FIG. 1B is a top illustration of a semiconductor arrangement at a stage of fabrication, in accordance with one or more embodiments, where FIG. 1A is taken along line 1-1 of FIG. 1B.

FIG. 2A is a cross sectional illustration of a semiconductor arrangement at a stage of fabrication, in accordance with one or more embodiments.

FIG. 2B is a top illustration of a semiconductor arrangement at a stage of fabrication, in accordance with one or more embodiments, where FIG. 2A is taken along line 2-2 of FIG. 2B.

FIG. 3A is taken along line 3-3 of FIG. 3B.

FIG. 4A is taken along line 4-4 of FIG. 4B.

FIG. 5A is a cross sectional illustration of a semiconductor arrangement at a stage of fabrication, in accordance with one or more embodiments.

FIG. 5B is a top illustration of a semiconductor arrangement at a stage of fabrication, in accordance with one or more embodiments, where FIG. 5A is taken along line 5-5 of FIG. 5B.

FIG. 6A is taken along line 6-6 of FIG. 6B.

FIG. 9A is taken along line 9-9 of FIG. 9B.

FIG. 10A is taken along line 10-10 of FIG. 10B.

FIG. 11A is taken along line 11-11 of FIG. 11B.

FIG. 12A is taken along line 12-12 of FIG. 12B.

FIG. 13A is a cross sectional illustration of a semiconductor arrangement at a stage of fabrication, in accordance with one or more embodiments.

FIG. 13B is a top illustration of a semiconductor arrangement at a stage of fabrication, in accordance with one or more embodiments, where FIG. 13A is taken along line 13-13 of FIG. 13B.

FIG. 14A is taken along line 14-14 of FIG. 14B.

FIG. 16A is a cross sectional illustration of a semiconductor arrangement at a stage of fabrication, in accordance with one or more embodiments.

FIG. 16B is a top illustration of a semiconductor arrangement at a stage of fabrication, in accordance with one or more embodiments, where FIG. 16A is taken along line 16-16 of FIG. 16B.

DETAILED DESCRIPTION

Figure 3B:
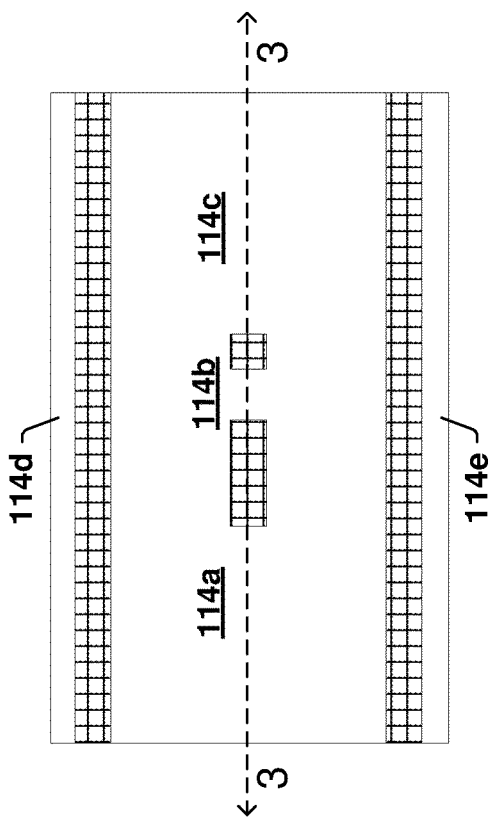
FIG. 3B is a top illustration of a semiconductor arrangement at a stage of fabrication, in accordance with one or more embodiments, where

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Some embodiments relate to fabricating a semiconductor arrangement. In accordance with some embodiments, the fabrication includes forming a first semiconductive layer over a first dielectric layer, patterning the first semiconductive layer to form a patterned first semiconductive layer, and patterning the first dielectric layer using the patterned first semiconductive layer to form a patterned first dielectric layer. The pattern formed in the patterned first dielectric layer is transferred to one or more underlying layers in some embodiments. According to some embodiments, a negative of the pattern formed in the patterned first dielectric layer is transferred to one or more underlying layers.

FIGS. 1A-16B illustrate a semiconductor arrangement 100 at various stages of fabrication, in accordance with some embodiments.

Referring to FIG. 1A, the semiconductor arrangement 100 is formed over a substrate 102. According to some embodiments, the substrate 102 comprises at least one of an epitaxial layer, a silicon-on-insulator (SOI) structure, a wafer, or a die formed from a wafer. According to some embodiments, one or more layers, structures, features, elements, etc. (not shown) are between the substrate 102 and the semiconductor arrangement 100.

According to some embodiments, the semiconductor arrangement 100 comprises one or more dielectric features 402a, 402b, 402c, 402d, etc. and one or more conductive features 404a, 404b, 404c, etc. In some embodiments, at least some of the dielectric features comprise interlayer dielectric (ILD). In some embodiments, at least some of the dielectric features comprise at least one of tetraethylorthosilicate (TEOS), borophosphosilicate glass (BPSG), fused silica glass (FSG), phosphosilicate glass (PSG), boron doped silicon glass (BSG), or other suitable materials. In some embodiments, at least some of the conductive features comprise a gate, such as of a transistor. In some embodiments, at least some of the conductive features comprise at least one of metal, doped polysilicon, or other suitable materials.

As illustrated in FIG. 1B, where FIG. 1A is a cross sectional view taken along line 1-1 of FIG. 1B, the semiconductor arrangement 100 comprises one or more dielectric plugs 401a1, 401a2, 401b1, 401c1, 401c2, etc., according to some embodiments. In some embodiments, at least some of the dielectric plugs comprise at least one of oxide, nitride, or other suitable materials. In some embodiments, at least some of the dielectric plugs separate or electrically isolate portions of the conductive features from one another. In some embodiments, 401a1 separates 404a1 from 404a2, 401a2 separates 404a2 from 404a3, 401b1 separates 404b1 from 404b2, 401c1 separates 404c1 from 404c2, and 401c2 separates 404c2 from 404c3. In some embodiments, where one or more of the conductive features comprise gates, such as for finFET transistors, the dielectric plugs make the gates discontinuous so that some portions of the gates are not electrically coupled to other portions of the gates.

Referring to FIG. 2A and FIG. 1B, where FIG. 2A is a cross sectional view taken along line 2-2 of FIG. 2B, the semiconductor arrangement 100 comprises at least one of a first dielectric layer 104, a metal layer 106, a second dielectric layer 108, a third dielectric layer 110, or a first semiconductive layer 112 over the dielectric features 402a, 402b, 402c, 402d and the conductive features 404a, 404b, 404c, according to some embodiments. In some embodiments, the first dielectric layer 104 is in direct contact with at least one of at least some of the dielectric features 402a, 402b, 402c, 402d or at least some of the conductive features 404a, 404b, 404c.

According to some embodiments, the first dielectric layer 104 is an ILD layer. In some embodiments, the first dielectric layer 104 comprises at least one of tetraethylorthosilicate (TEOS), borophosphosilicate glass (BPSG), fused silica glass (FSG), phosphosilicate glass (PSG), boron doped silicon glass (BSG), or other suitable materials. In some embodiments, the first dielectric layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

According to some embodiments, the metal layer 106 comprises at least one of tungsten, carbide, or other suitable materials. According to some embodiments, the metal layer 106 comprises metal but has little to no electrical conductivity. According to some embodiments, the metal layer 106 is formed by at least one of PVD, sputtering, CVD, LPCVD, ALCVD, UHVCVD, RPCVD, MBE, LPE, or other suitable techniques. In some embodiments, the metal layer 106 is in direct contact with the first dielectric layer 104.

According to some embodiments, the second dielectric layer 108 comprises at least one of oxide or other suitable materials. According to some embodiments, the second dielectric layer 108 has different composition than the first dielectric layer 104. According to some embodiments, the second dielectric layer 108 has a same composition as the first dielectric layer 104. According to some embodiments, the second dielectric layer 108 is formed by at least one of PVD, sputtering, CVD, LPCVD, ALCVD, UHVCVD, RPCVD, MBE, LPE, or other suitable techniques. In some embodiments, the second dielectric layer 108 is in direct contact with the metal layer 106.

According to some embodiments, the third dielectric layer 110 comprises at least one of oxide, nitride, silicon nitride (SiN), or other suitable materials. According to some embodiments, the third dielectric layer 110 has a different composition than the first dielectric layer 104. According to some embodiments, the third dielectric layer 110 has a same composition as the first dielectric layer 104. According to some embodiments, the third dielectric layer 110 has a different composition than the second dielectric layer 108. According to some embodiments, the third dielectric layer 110 has a same composition as the second dielectric layer 108. According to some embodiments, the third dielectric layer 110 is formed by at least one of PVD, sputtering, CVD, LPCVD, ALCVD, UHVCVD, RPCVD, MBE, LPE, or other suitable techniques. In some embodiments, the third dielectric layer 110 is in direct contact with the second dielectric layer 108.

According to some embodiments, the first semiconductive layer 112 comprises at least one of silicon (Si) or other suitable materials. According to some embodiments, the first semiconductive layer 112 is formed by at least one of PVD, sputtering, CVD, LPCVD, ALCVD, UHVCVD, RPCVD, MBE, LPE, or other suitable techniques. In some embodiments, the first semiconductive layer 112 is in direct contact with the third dielectric layer 110.

Figure 3A:
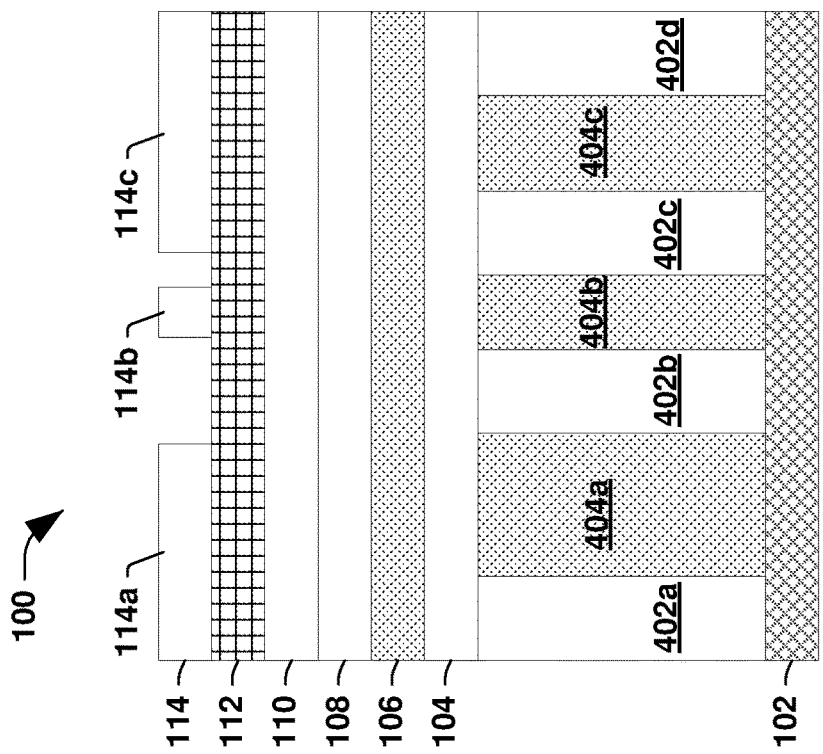
FIG. 3A is a cross sectional illustration of a semiconductor arrangement at a stage of fabrication, in accordance with one or more embodiments.

Referring to FIG. 3A and FIG. 3B, where FIG. 3A is a cross sectional view taken along line 3-3 of FIG. 3B, a photoresist layer 114 is formed over the semiconductive layer 112 and patterned such that a first portion 114a of the photoresist layer 114, a second portion 114b of the photoresist layer 114, a third portion 114c of the photoresist layer 114, a fourth portion 114d of the photoresist layer 114, and a fifth portion 114e of the photoresist layer 114 remain over the first semiconductive layer 112, according to some embodiments. According to some embodiments, the photoresist layer 114 comprises a light-sensitive material such that properties, such as solubility, of the photoresist layer 114 are affected by light. The photoresist layer 114 is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of a template between the light source and the positive photoresist.

In some embodiments, the photoresist layer 114 comprises multiple layers (not shown). According to some embodiments, the photoresist layer 114 comprises three layers: a top layer, a middle layer under the top layer, and a bottom layer under the middle layer. In some embodiments, the top layer comprises a light sensitive material as described above. In some embodiments, the middle layer comprises an anti-reflective material to aid in at least one of exposure or focus of processing the light sensitive material. In some embodiments, the bottom layer comprises a hard mask material, such as at least one of nitride or other suitable materials. In some embodiments, the photoresist layer 114 is in direct contact with the first semiconductive layer 112.

Figure 4B:
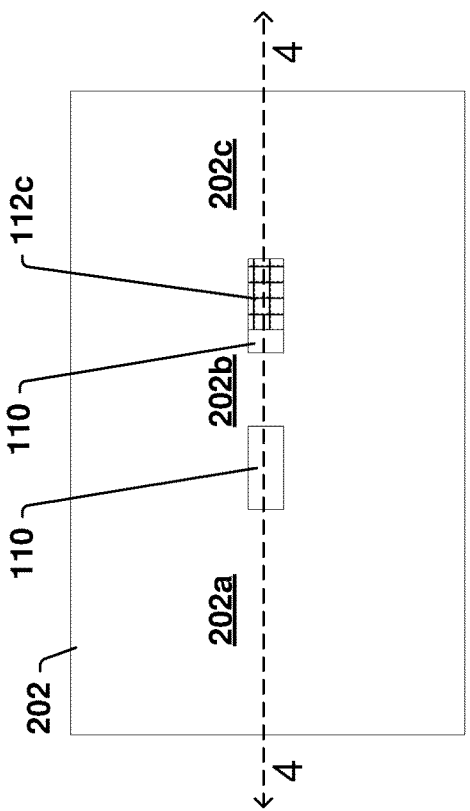
FIG. 4B is a top illustration of a semiconductor arrangement at a stage of fabrication, in accordance with one or more embodiments, where
Figure 4A:
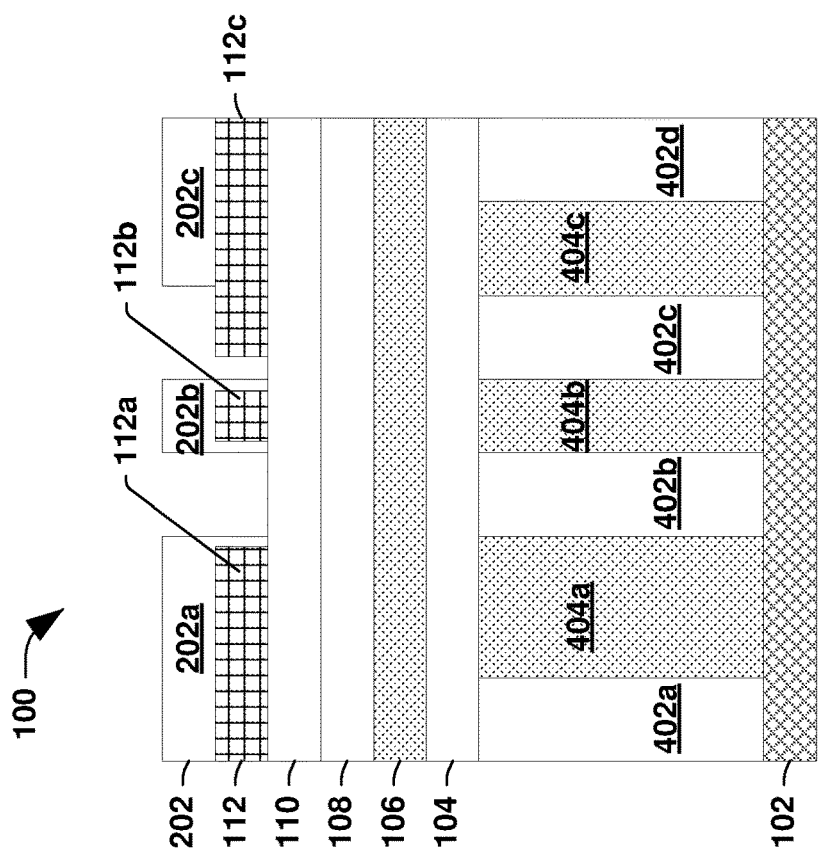
FIG. 4A is a cross sectional illustration of a semiconductor arrangement at a stage of fabrication, in accordance with one or more embodiments.

FIG. 4A and FIG. 4B illustrate the pattern in the photoresist layer 114 (of FIG. 3A and FIG. 3B) transferred to the first semiconductive layer 112 to form a patterned semiconductive layer, where FIG. 4A is a cross sectional view taken along line 4-4 of FIG. 4B, such that the patterned semiconductive layer comprises a first portion 112a of the first semiconductive layer 112, a second portion 112b of the first semiconductive layer 112, and a third portion 112c of the first semiconductive layer 112, according to some embodiments. According to some embodiments, an etching process is performed to pattern the first semiconductive layer 112, where the first portion 114a (of FIG. 3A and FIG. 3B) of the photoresist layer 114 protects or shields the first portion 112a of the first semiconductive layer 112 from an etchant applied during the etching process, the second portion 114b (of FIG. 3A and FIG. 3B) of the photoresist layer 114 protects or shields the second portion 112b of the first semiconductive layer 112 from the etchant applied during the etching process, and the third portion 114c (of FIG. 3A and FIG. 3B) of the photoresist layer 114 protects or shields the third portion 112c of the first semiconductive layer 112 from the etchant applied during the etching process. Portions of the first semiconductive layer 112 not covered by the photoresist layer 114 are exposed to the etchant and are removed or etched away during the etching process to expose portions of the third dielectric layer 110. The patterned photoresist layer 114 is then washed away, stripped, or otherwise removed. According to some embodiments, the etchant used to pattern the first semiconductive layer 112 is at least one of chlorine, hydrogen bromide, or other suitable chemicals.

As illustrated in FIG. 4A and FIG. 4B, a second photoresist layer 202 is formed over the patterned first semiconductive layer 112a, 112b, 112c and exposed portions of the third dielectric layer 110, in some embodiments. According to some embodiments, the second photoresist layer 202 is patterned such that a first portion 202a of the second photoresist layer 202 covers all of the first portion 112a of the first semiconductive layer 112, a second portion 202b of the second photoresist layer 202 covers all of the second portion 112b of the first semiconductive layer 112, but a third portion 202c of the second photoresist layer 202 covers some but not all of the third portion 112c of the first semiconductive layer 112.

FIG. 5A and FIG. 5B illustrates the semiconductor arrangement 100 after a second etching process is performed and the patterned second photoresist layer 202 is washed away, stripped, or otherwise removed, according to some embodiments, where FIG. 5A is a cross sectional view taken along line 5-5 of FIG. 5B. Given that the first portion 202a (of FIG. 4A) of the second photoresist layer 202 covered all of the first portion 112a of the first semiconductive layer 112, all of the first portion 112a of the first semiconductive layer 112 remains after the second etching process. Given that the second portion 202b (of FIG. 4A) of the second photoresist layer 202 covered all of the second portion 112b of the first semiconductive layer 112, all of the second portion 112b of the first semiconductive layer 112 remains after the second etching process. FIG. 5B also illustrates a fourth portion 112d of the first semiconductive layer 112 and a fifth portion 112e of the first semiconductive layer 112 that remain after the first etching process and that were similarly covered and protected by the second photoresist layer 202 during the second etching process. However, given that the third portion 202c (of FIG. 4A) of the second photoresist layer 202 covered some but not all of the third portion 112c of the first semiconductive layer 112, merely some of the third portion 112c of the first semiconductive layer 112 remains after the second etching process. The part of the third portion 112c of the first semiconductive layer 112 that was not covered by the third portion 202c of the second photoresist layer 202 is removed or etched away by an etchant that is applied during the second etching process such that the third portion 112c of the first semiconductive layer 112 has a first cross-sectional profile before the second etching process and a second cross-sectional profile after the second etching process. According to some embodiments, a dimension, such as width, depth, etc., of the third portion 112c of the first semiconductive layer 112 is different in the first cross-sectional profile as compared to the second cross-sectional profile. According to some embodiments, the multiple patterning actions, such as to alter the third portion 112c of the first semiconductive layer 112 is, at times, referred to as double patterning.

According to some embodiments, portions of the third dielectric layer 110 not covered by the second photoresist layer 202 are exposed to the etchant during the second etching process such that a first recess 302 and a second recess 304 are formed in the third dielectric layer 110. In some embodiments, limitations associated with photolithography require one or more patterning operations to be performed to achieve a desired dimension, shape, etc. of a feature, such as that of the third portion 112c of the first semiconductive layer 112 after the second etching process is performed. According to some embodiments, one or more subsequent patterning and etching operations, in addition to what is illustrated and described with regard to the patterned first photoresist layer 114 of FIG. 3A and FIG. 3B and the patterned second photoresist layer 202 of FIG. 2A and FIG. 2B, are required to achieve the desired dimension, shape, etc. of a feature. According to some embodiments, the third dielectric layer 110 is formed to have a thickness such that any recess(es) formed in the third dielectric layer 110 due to one or more patterning and etching operations do not expose the second dielectric layer 108. According to some embodiments, a lack of exposure of the second dielectric layer 108 to one or more etchants, such as $O_2$ or a carbon-rich gas in a dry etching process, inhibits stitching in the second dielectric layer 108. According to some embodiments, stitching corresponds to one or more recesses being formed in the second dielectric layer 108, such as where the first recess 302 is transferred to the second dielectric layer 108. According to some embodiments, inhibiting the formation of one or more recesses in the second dielectric layer 108 promotes a desired composition of the second dielectric layer 108, such as by not providing a location, such as a recess, for undesired materials to be deposited or otherwise accumulate within the second dielectric layer 108. Having a desired composition of the second dielectric layer 108 promotes desired operation of a device comprising the semiconductor arrangement 100.

Figure 6B:
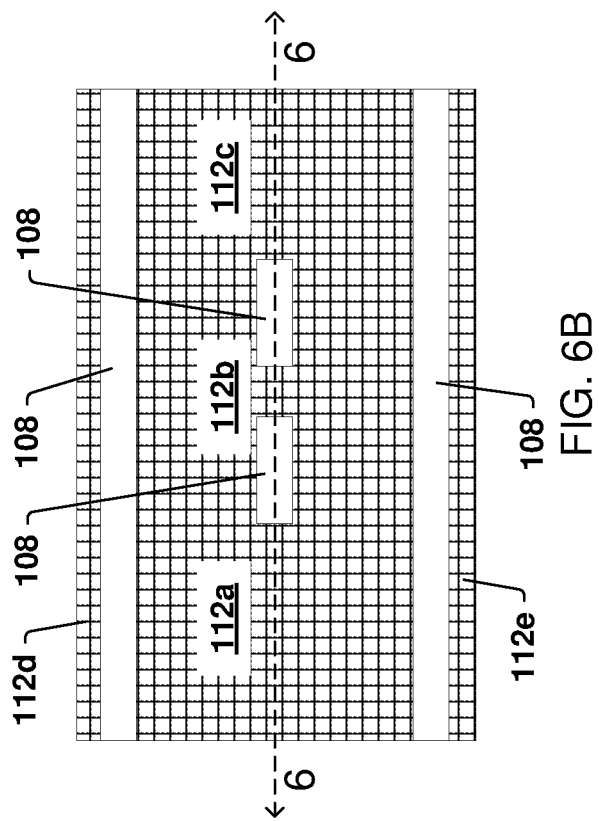
FIG. 6B is a top illustration of a semiconductor arrangement at a stage of fabrication, in accordance with one or more embodiments, where
Figure 6A:
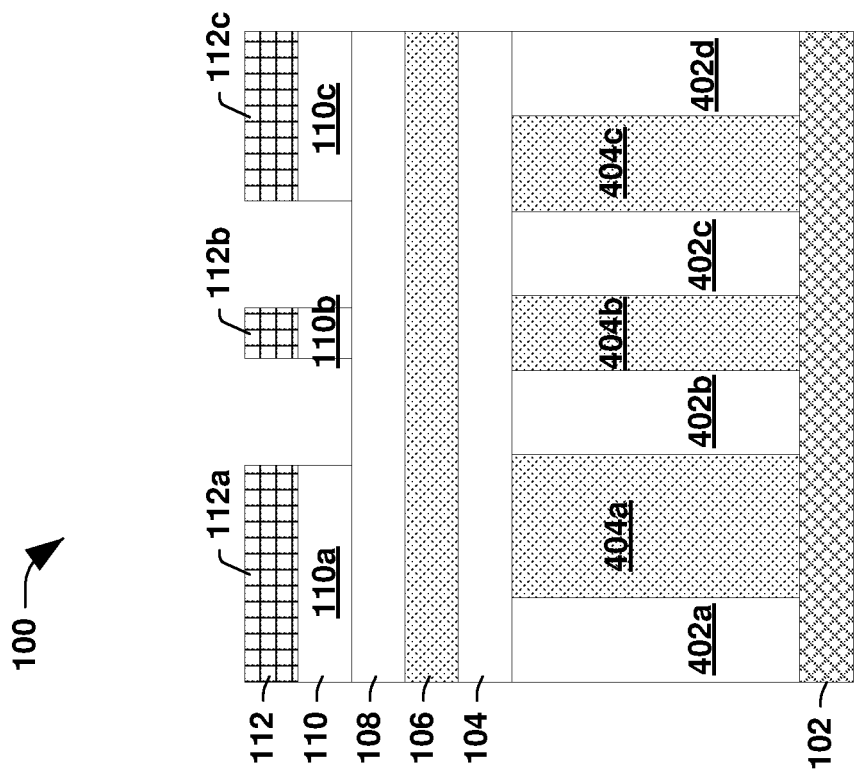
FIG. 6A is a cross sectional illustration of a semiconductor arrangement at a stage of fabrication, in accordance with one or more embodiments.

FIG. 6A and FIG. 6B illustrate the pattern in the patterned first semiconductive layer 112 transferred to the third dielectric layer 110 to form a patterned third dielectric layer, wherein FIG. 6A is a cross sectional view taken along line 6-6 of FIG. 6B, such that the patterned third dielectric layer comprises a first portion 110a of the third dielectric layer 110, a second portion 110b of the third dielectric layer 110, and a third portion 110c of the third dielectric layer 110, according to some embodiments. According to some embodiments, an etching process is performed to pattern the third dielectric layer 110, where the first portion 112a of the first semiconductive layer 112 protects or shields the first portion 110a of the third dielectric layer 110 from an etchant applied during the etching process, the second portion 112b of the first semiconductive layer 112 protects or shields the second portion 110b of the third dielectric layer 110 from the etchant applied during the etching process, and the third portion 112c of the first semiconductive layer 112 protects or shields the third portion 110c of the third dielectric layer 110 from the etchant applied during the etching process. According to some embodiments, the fourth portion 112d of the first semiconductive layer 112 protects or shields a fourth portion (not shown) of the third dielectric layer 110 and the fifth portion 112e of the first semiconductive layer 112 protects or shields a fifth portion (not shown) of the third dielectric layer 110. Portions of the third dielectric layer 110 not covered by the first semiconductive layer 112 are exposed to the etchant and are removed or etched away during the etching process to expose portions of the second dielectric layer 108. According to some embodiments, the etchant used to etch the third dielectric layer 110 is selective such that the etchant does not etch the second dielectric layer 108. According to some embodiments, the etchant used to pattern the third dielectric layer 110 is at least one of carbon-rich gas, $O_2$, or other suitable chemicals.

As will be appreciated from the disclosure herein, implementing the first semiconductive layer 112 facilitates forming features, elements, etc. that have desired profiles, such as substantially vertical sidewalls, according to some embodiments. By way of example, if the third dielectric layer 110 is patterned in the absence of the first semiconductive layer 112, sidewalls of the third dielectric layer 110 are tapered or not sufficiently vertical. If, for example, the third dielectric layer 110 comprises SiN and a patterned photoresist is implemented to pattern the third dielectric layer 110, an etchant used to pattern the third dielectric layer 110 also etches the patterned photoresist, such as laterally where $O_2$ of the etchant consumes a bottom layer or portion of the photoresist. The patterned photoresist thus has at least one of a smaller dimension than desired or a tapered or non-liner sidewall, which is transferred to the third dielectric layer 110. Such etching techniques include, for example, implementing at least one of a high bias, a polymer lean gas, a carbon-rich gas, or $O_2$. Implementing a high bias or a polymer lean gas, for example, results in stitching or undesired removal of at least one of some of the second dielectric layer 108 and thus an undesired recess in the second dielectric layer 108, where unwanted residue accumulates in the recess. Implementing a carbon-rich gas or $O_2$, for example, in the absence of the first semiconductive layer 112 results in the aforementioned tapered profile of the photoresist and third dielectric layer 110. Implementing the first semiconductive layer 112 allows an etching process to be implemented where the first portion 110a, the second portion 110b, the third portion 110c, the fourth portion, and the fifth portion of the third dielectric layer 110 have substantially vertical sidewalls. According to some embodiments, an etch selectivity of the first semiconductive layer 112 relative to an etchant, such as a carbon-rich gas or $O_2$, allows at least one of an amount or composition of etchant to be used to etch the third dielectric layer 110 such that the first portion 110a, the second portion 110b, the third portion 110c, the fourth portion, and the fifth portion of the third dielectric layer 110 have substantially vertical sidewalls, while also inhibiting unwanted side effects of the etching process. According to some embodiments, the patterned semiconductive layer 112 acts as hardmasks for the third dielectric layer 110.

Figure 7:
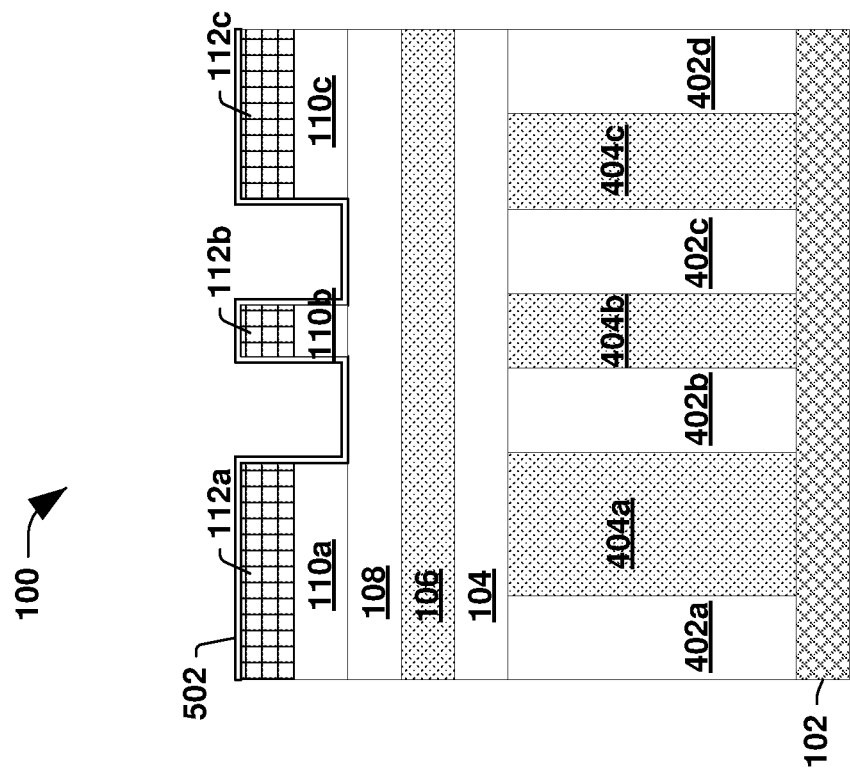
FIG. 7 is a cross sectional illustration of a semiconductor arrangement at a stage of fabrication, in accordance with one or more embodiments.

FIG. 7 illustrates a fourth dielectric layer 502 formed over the first portion 112a of the first semiconductive layer 112, the first portion 110a of the third dielectric layer 110, the second portion 112b of the first semiconductive layer 112, the second portion 110b of the third dielectric layer 110, the third portion 112c of the first semiconductive layer 112, the third portion 110c of the third dielectric layer 110, and the second dielectric layer 108, according to some embodiments. In some embodiments, the fourth dielectric layer 502 is conformal so as to form on at least one of a sidewall of the first portion 112a of the first semiconductive layer 112, a sidewall of the first portion 110a of the third dielectric layer 110, a sidewall of the second portion 112b of the first semiconductive layer 112, a sidewall of the second portion 110b of the third dielectric layer 110, a sidewall of the third portion 112c of the first semiconductive layer 112, or a sidewall of the third portion 110c of the third dielectric layer 110, as well as on at least one of a top surface of the first portion 112a of the first semiconductive layer 112, a top surface of the second portion 112b of the first semiconductive layer 112, a top surface of the third portion 112c of the first semiconductive layer 112, or an exposed portion of the second dielectric layer 108. According to some embodiments, the fourth dielectric layer 502 has a uniform thickness. According to some embodiments, the fourth dielectric layer 502 comprises at least one of oxide, nitride, silicon nitride (SiN), or other suitable materials. According to some embodiments, the fourth dielectric layer 502 has a different composition than the first dielectric layer 104. According to some embodiments, the fourth dielectric layer 502 has a same composition as the first dielectric layer 104. According to some embodiments, the fourth dielectric layer 502 has a different composition than the second dielectric layer 108. According to some embodiments, the fourth dielectric layer 502 has a same composition as the second dielectric layer 108. According to some embodiments, the fourth dielectric layer 502 has a different composition than the third dielectric layer 110. According to some embodiments, the fourth dielectric layer 502 has a same composition as the third dielectric layer 110. According to some embodiments, the fourth dielectric layer 502 is formed by at least one of PVD, sputtering, CVD, LPCVD, ALCVD, UHVCVD, RPCVD, MBE, LPE, or other suitable techniques. In some embodiments, the fourth dielectric layer 502 is in direct contact with at least one of the first portion 112a of the first semiconductive layer 112, the first portion 110a of the third dielectric layer 110, the second portion 112b of the first semiconductive layer 112, the second portion 110b of the third dielectric layer 110, or the second dielectric layer 108.

Figure 8:
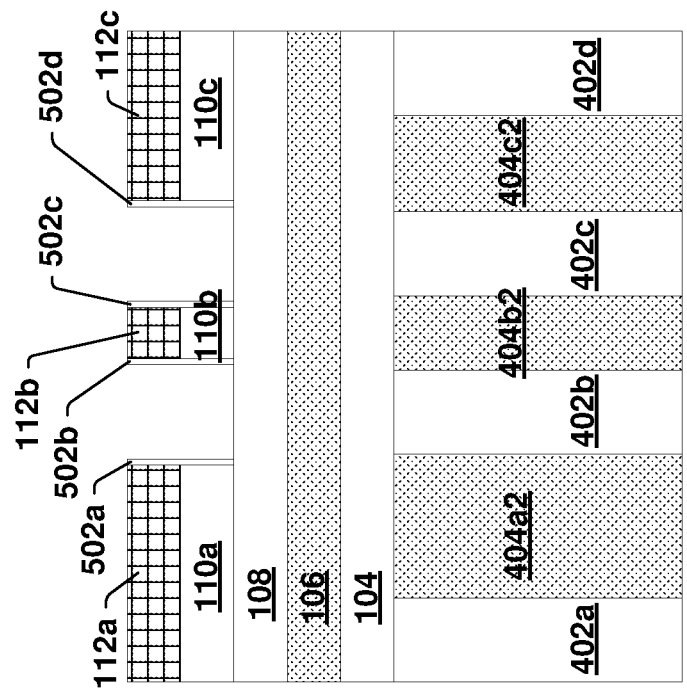
FIG. 8 is a cross sectional illustration of a semiconductor arrangement at a stage of fabrication, in accordance with one or more embodiments.

FIG. 8 illustrates some of the fourth dielectric layer 502 removed, according to some embodiments. In some embodiments, at least one vertical portion 502a, 502b, 502c, or 502d of the fourth dielectric layer 502 remains on at least one of a sidewall of the first portion 112a of the first semiconductive layer 112, a sidewall of the first portion 110a of the third dielectric layer 110, a sidewall of the second portion 112b of the first semiconductive layer 112, a sidewall of the second portion 110b of the third dielectric layer 110, a sidewall of the third portion 112c of the first semiconductive layer 112, or a sidewall of the third portion 110c of the third dielectric layer 110. According to some embodiments, an etching process is performed to remove some of the fourth dielectric layer 502. In some embodiments, the etching process comprises at least one of a plasma etching process, a reactive ion etching (RIE) process, a wet etching process, or other suitable techniques. In some embodiments, the etching process utilizes at least one of $CF_4$, $Cl_2$, $CHF_3$, or other suitable materials.

Figure 9B:
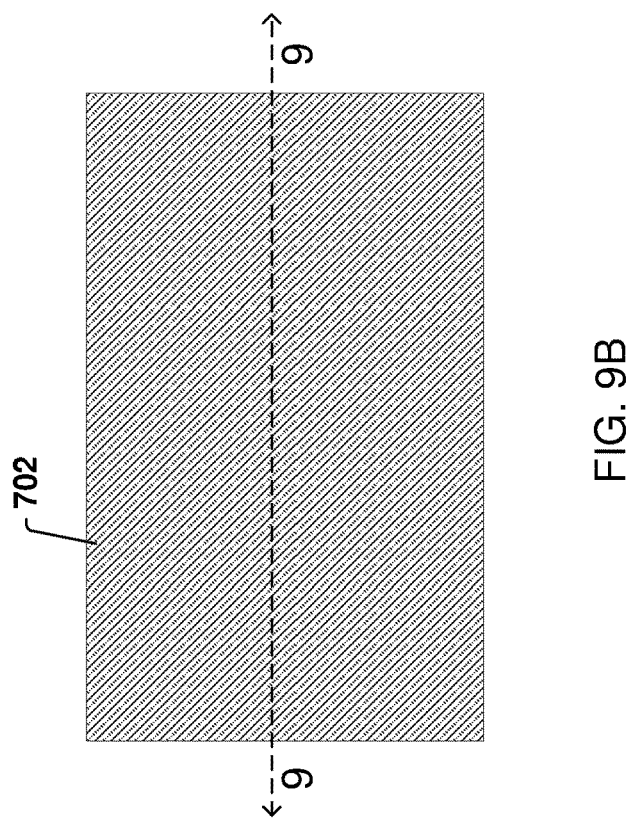
FIG. 9B is a top illustration of a semiconductor arrangement at a stage of fabrication, in accordance with one or more embodiments, where
Figure 9A:
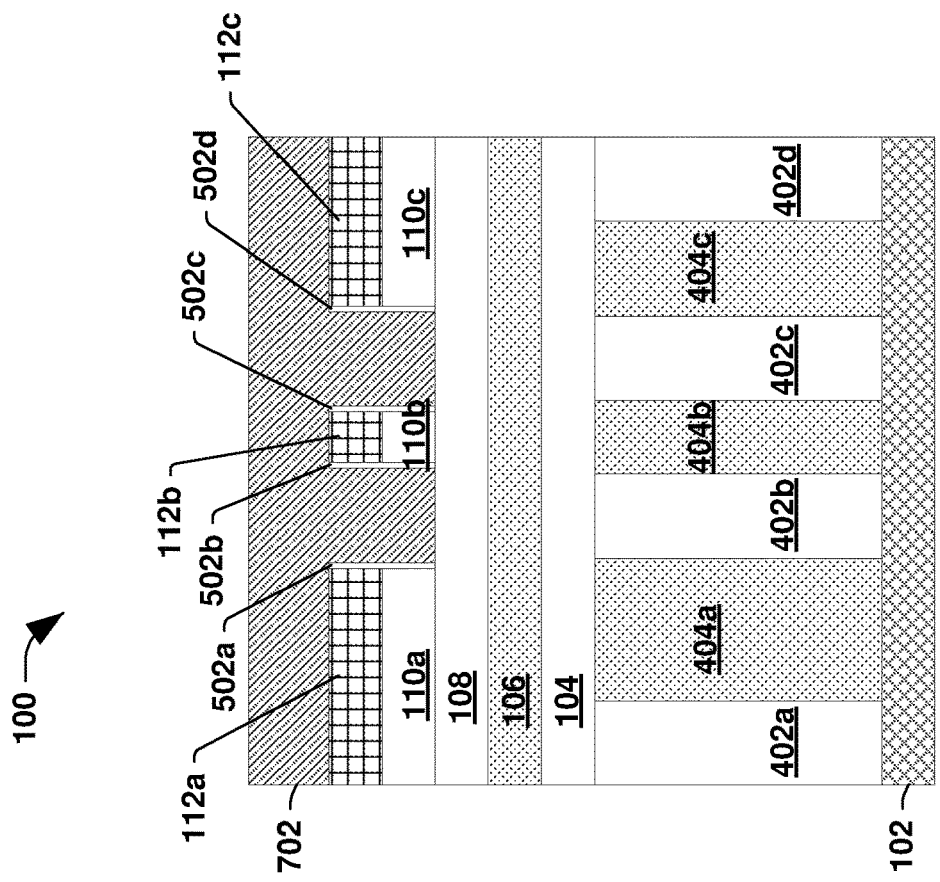
FIG. 9A is a cross sectional illustration of a semiconductor arrangement at a stage of fabrication, in accordance with one or more embodiments.

Referring to FIG. 9A and FIG. 9B, where FIG. 9A is a cross sectional view taken along line 9-9 of FIG. 9B, a second semiconductive layer 702 formed over the first portion 112a of the first semiconductive layer 112, the second portion 112b of the first semiconductive layer 112, the third portion 112c of the first semiconductive layer 112, the vertical portion 502a of the fourth dielectric layer 502, the vertical portion 502b of the fourth dielectric layer 502, the vertical portion 502c of the fourth dielectric layer 502, the vertical portion 502d of the fourth dielectric layer 502, and the second dielectric layer 108, according to some embodiments. According to some embodiments, the second semiconductive layer 702 comprises at least one of Si or other suitable materials. In some embodiments, the second semiconductive layer 702 has a different composition than the first semiconductive layer 112. In some embodiments, the second semiconductive layer 702 has a same composition as the first semiconductive layer 112. According to some embodiments, the second semiconductive layer 702 is formed by at least one of PVD, sputtering, CVD, LPCVD, ALCVD, UHVCVD, RPCVD, MBE, LPE, or other suitable techniques. In some embodiments, the second semiconductive layer 702 is in direct contact with at least one of the first portion 112a of the first semiconductive layer 112, the second portion 112b of the first semiconductive layer 112, the third portion 112c of the first semiconductive layer 112, the vertical portion 502a of the fourth dielectric layer 502, the vertical portion 502b of the fourth dielectric layer 502, the vertical portion 502c of the fourth dielectric layer 502, the vertical portion 502d of the fourth dielectric layer 502, or the second dielectric layer 108.

Figure 10B:
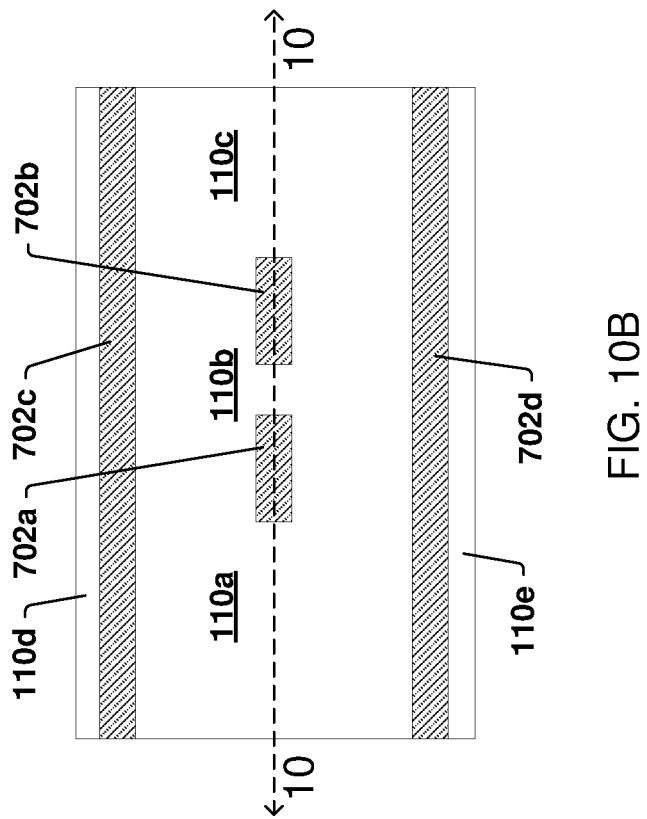
FIG. 10B is a top illustration of a semiconductor arrangement at a stage of fabrication, in accordance with one or more embodiments, where
Figure 10A:
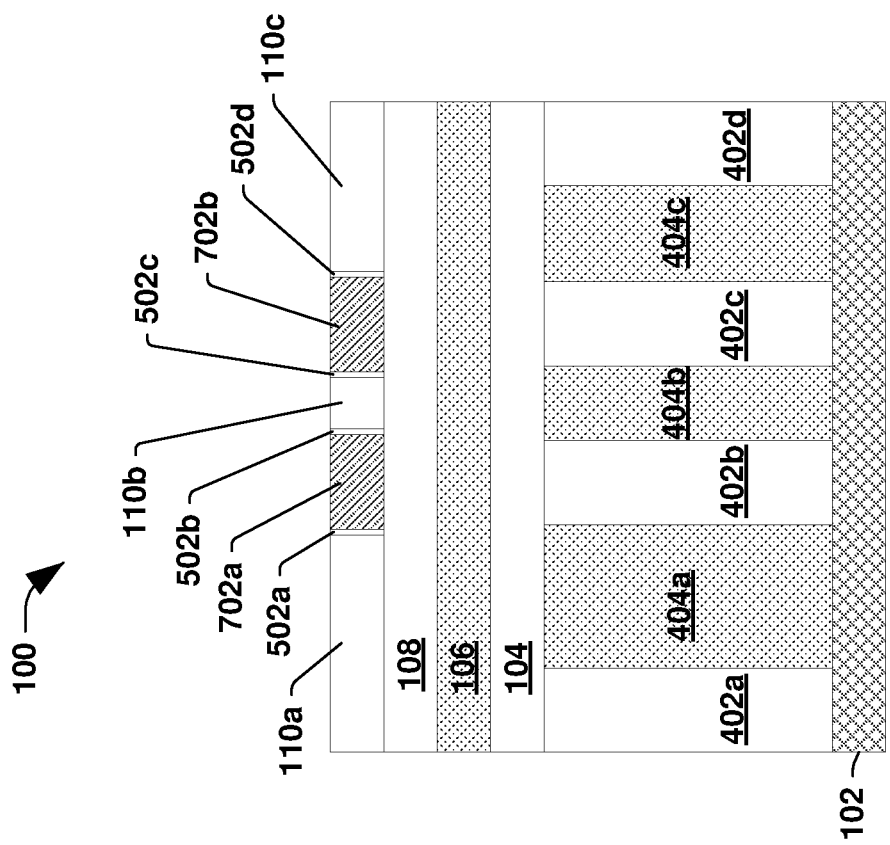
FIG. 10A is a cross sectional illustration of a semiconductor arrangement at a stage of fabrication, in accordance with one or more embodiments.

Referring to FIG. 10A and FIG. 10B, where FIG. 10A is a cross sectional view taken along line 10-10 of FIG. 10B, at least some of the second semiconductive layer 702, some of the vertical portion 502a of the fourth dielectric layer 502, some of the vertical portion 502b of the fourth dielectric layer 502, some of the vertical portion 502c of the fourth dielectric layer 502, some of the vertical portion 502d of the fourth dielectric layer 502, the first portion 112a of the first semiconductive layer 112, the second portion 112b of the first semiconductive layer 112, and the third portion 112c of the first semiconductive layer 112 are removed, according to some embodiments. According to some embodiments, the removal is performed by at least one of CMP or other suitable techniques. In some embodiments, an uppermost surface of at least two of remaining portion 702a of the second semiconductive layer 702, remaining portion 702b of the second semiconductive layer 702, remaining portion 702c of the second semiconductive layer 702, remaining portion 702d of the second semiconductive layer 702, the vertical portion 502a of the fourth dielectric layer 502, the vertical portion 502b of the fourth dielectric layer 502, the vertical portion 502c of the fourth dielectric layer 502, the vertical portion 502d of the fourth dielectric layer 502, the first portion 110a of the third dielectric layer 110, the second portion 110b of the third dielectric layer 110, the third portion 110c of the third dielectric layer 110, a fourth portion 110d of the third dielectric layer 110, or a fifth portion 110e of the third dielectric layer 110 are coplanar after the removal.

Figure 11B:
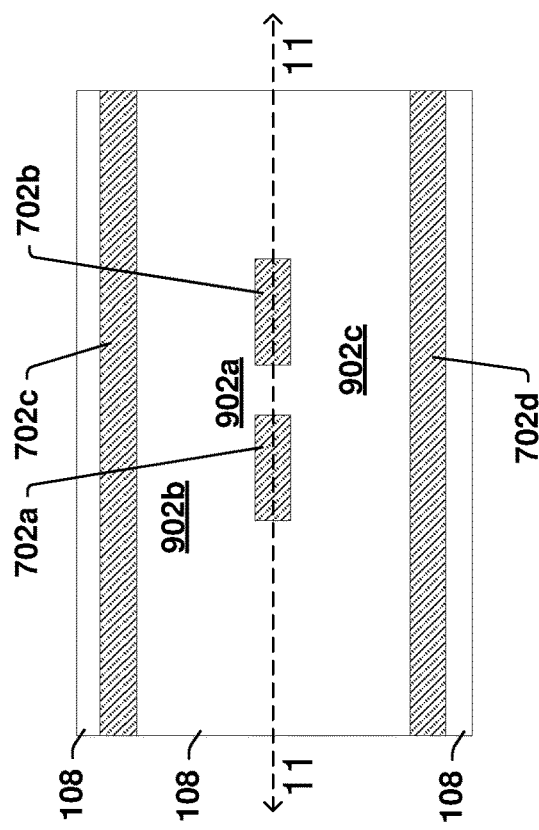
FIG. 11B is a top illustration of a semiconductor arrangement at a stage of fabrication, in accordance with one or more embodiments, where
Figure 11A:
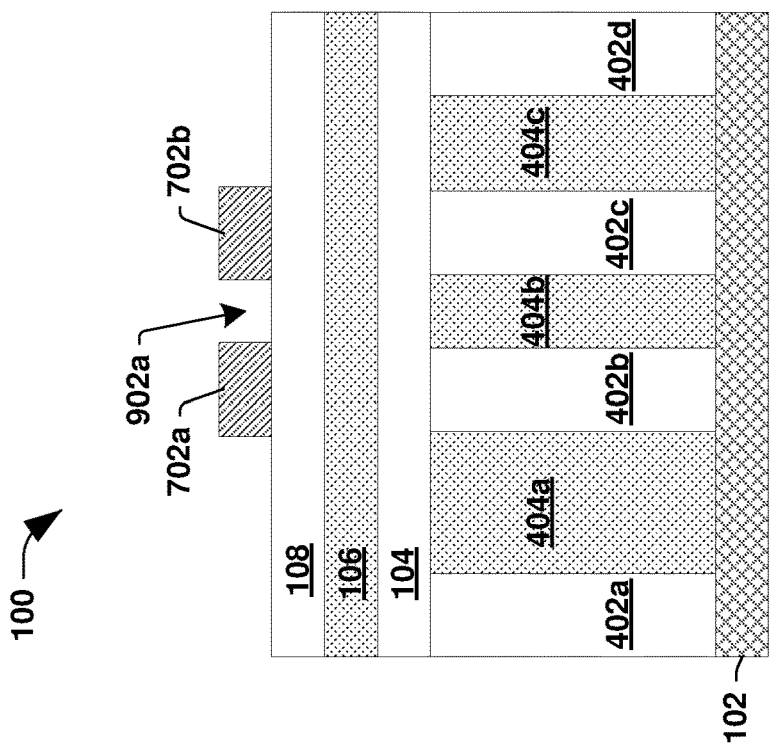
FIG. 11A is a cross sectional illustration of a semiconductor arrangement at a stage of fabrication, in accordance with one or more embodiments.

Referring to FIG. 11A and FIG. 11B, where FIG. 11A is a cross sectional view taken along line 11-11 of FIG. 11B, the vertical portion 502a of the fourth dielectric layer 502, the vertical portion 502b of the fourth dielectric layer 502, the vertical portion 502c of the fourth dielectric layer 502, the vertical portion 502d of the fourth dielectric layer 502, the first portion 110a of the third dielectric layer 110, the second portion 110b of the third dielectric layer 110, and the third portion 110c of the third dielectric layer 110 are removed, according to some embodiments. A patterned second semiconductive layer comprising the remaining portion 702a of the second semiconductive layer 702, the remaining portion 702b of the second semiconductive layer 702, the remaining portion 702c of the second semiconductive layer 702, and the remaining portion 702d of the second semiconductive layer 702 remains after the removal, according to some embodiments. According to some embodiments, a recess 902a is defined between the remaining portion 702a of the second semiconductive layer 702 and the remaining portion 702b of the second semiconductive layer 702. According to some embodiments, a recess 902b is defined between the remaining portions 702a, 702b of the second semiconductive layer 702 and the remaining portion 702c of the second semiconductive layer 702. According to some embodiments, a recess 902c is defined between the remaining portions 702a, 702b of the second semiconductive layer 702 and the remaining portion 702d of the second semiconductive layer 702. In some embodiments, the removal is performed by an etching process. According to some embodiments, the etching process is at least one of a plasma etching process, a RIE process, a wet etching process, or other suitable techniques. In some embodiments, the etching process utilizes at least one of $CF_4$, $Cl_2$, $CHF_3$, or other suitable materials. In some embodiments, one or more of the sidewalls of 702a, 702b, 702c, 702d that define the recesses are substantially vertical. In some embodiments, at least some of the aforementioned sidewalls are substantially vertical due to at least one of the selectively of the etchant of the etching process or a directionality of the etching process.

Figure 12B:
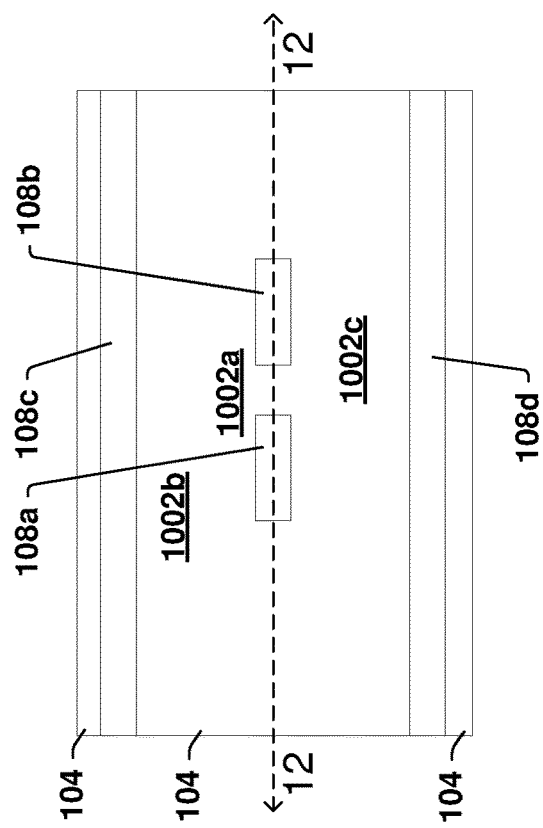
FIG. 12B is a top illustration of a semiconductor arrangement at a stage of fabrication, in accordance with one or more embodiments, where
Figure 12A:
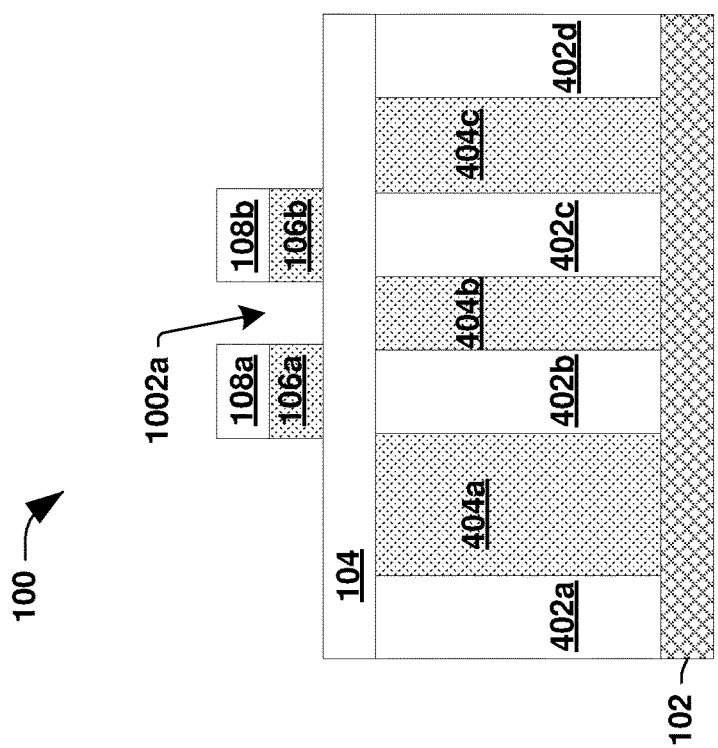
FIG. 12A is a cross sectional illustration of a semiconductor arrangement at a stage of fabrication, in accordance with one or more embodiments.

Referring to FIG. 12A and FIG. 12B, where FIG. 12A is a cross sectional view taken along line 12-12 of FIG. 12B, the pattern in the patterned second semiconductive layer 702a, 702b, 702c, 702d is transferred to the second dielectric layer 108 and the metal layer 106 to form a patterned second dielectric layer and a patterned metal layer, and the patterned second semiconductive layer is removed, according to some embodiments. According to some embodiments, the patterned second semiconductive layer 702a, 702b, 702c, 702d is removed by at least one of CMP or other suitable techniques. In some embodiments, the patterned second dielectric layer comprises a first portion 108a of the second dielectric layer 108, a second portion 108b of the second dielectric layer 108, a third portion 108c of the second dielectric layer 108, and a fourth portion 108d of the second dielectric layer 108. In some embodiments, the patterned metal layer comprises a first portion 106a of the metal layer 106, a second portion 106b of the metal layer 106, a third portion (not shown) of the metal layer 106, and a fourth portion (not shown) of the metal layer 106. According to some embodiments, an etching process is performed to pattern at least one of the second dielectric layer 108 or the metal layer 106, where the portions 702a, 702b, 702c, 702d of the second semiconductive layer 702 protect or shield the portions 108a, 108b, 108c, 108d of the second dielectric layer 108 from an etchant applied during the etching process. Portions of the second dielectric layer 108 not covered by the second semiconductive layer 702 are exposed to the etchant and are removed or etched away during the etching process to expose portions of the metal layer 106. Exposed portions of the metal layer 106 are then exposed to the same etchant or a different etchant(s) and removed or etched away during the etching process. According to some embodiments, a first recess 1002a is defined between the first portion 108a of the second dielectric layer 108 and the second portion 108b of the second dielectric layer 108 and between the first portion 106a of the metal layer 106 and the second portion 106b of the metal layer 106. According to some embodiments, a second recess 1002b is defined between the first 108a and second 108b portions of the second dielectric layer 108 and the third portion 108c of the second dielectric layer 108 and between the first 106a and second 106b portions of the metal layer 106 and the third portion (not shown) of the metal layer 106. According to some embodiments, a third recess 1002c is defined between the first 108a and second 108b portions of the second dielectric layer 108 and the fourth portion 108d of the second dielectric layer 108 and between the first 106a and second 106b portions of the metal layer 106 and the fourth portion (not shown) of the metal layer 106. In some embodiments, in addition to the etching process(es) used, the substantially vertical sidewalls of 702a, 702b, 702c, 702d result in sidewalls of 108a, 108b, 108c, 108d, 106a, 106b, 106c (FIG. 13B), 106d (FIG. 13B) that define the recesses 1002a, 1002b, 1002c being substantially vertical.

Referring to FIG. 13A and FIG. 13B, where FIG. 13A is a cross sectional view taken along line 13-13 of FIG. 13B, dielectric material is removed, such as the portions 108a, 108b, 108c, 108d of the second dielectric layer 108, exposed portions of the first dielectric layer 104, some of the dielectric feature 402a, and some of the dielectric feature 402d, according to some embodiments. According to some embodiments, such removal occurs by way of at least one of etching or other suitable techniques.

As illustrated in FIG. 13B, removal of the dielectric material exposes the first portion 106a of the metal layer 106, the second portion 106b of the metal layer 106, the third portion 106c of the metal layer 106, and the fourth portion 106d of the metal layer 106, according to some embodiments. Removal of the dielectric material exposes portions 404a1, 404a2, 404a3, 404b1, 404b2, 404c1, 404c2, and 404c3 of the conductive features that are not covered by the portions 106a, 106b, 106c, 106d of the metal layer 106, according to some embodiments. Removal of the dielectric material exposes dielectric plugs 401a1, 401a2, 401b1, 401c1, 401c2, according to some embodiments. Removal of the dielectric material exposes epitaxy regions 410a1, 410a2, 410b1, 410b2, 410c1, 410c2, 410d1, 410d2, according to some embodiments. In some embodiments, an epitaxy region serves as a source or a drain or as a point for electrical contact to a source or a drain of a transistor, such as a finFET transistor. According to some embodiments, a fin of a finFET transistor underlies a conductive feature, such as where the conductive feature operates as a gate of the finFET transistor. According to some embodiments, the fin also underlies or is otherwise electrically connected to first and second epitaxy regions, such as where the first epitaxy region operates as a source or as a point for electrical contact to the source of the finFET transistor and where the second epitaxy region operates as a drain or as a point for electrical contact to the drain of the finFET transistor. Removal of the dielectric material exposes portions of the dielectric features 402a, 402b, 402c, 402d not covered by at least one of the portions 106a, 106b, 106c, 106d of the metal layer 106 or the epitaxy regions 410a1, 410a2, 410b1, 410b2, 410c1, 410c2, 410d1, 410d2.

Figure 14B:
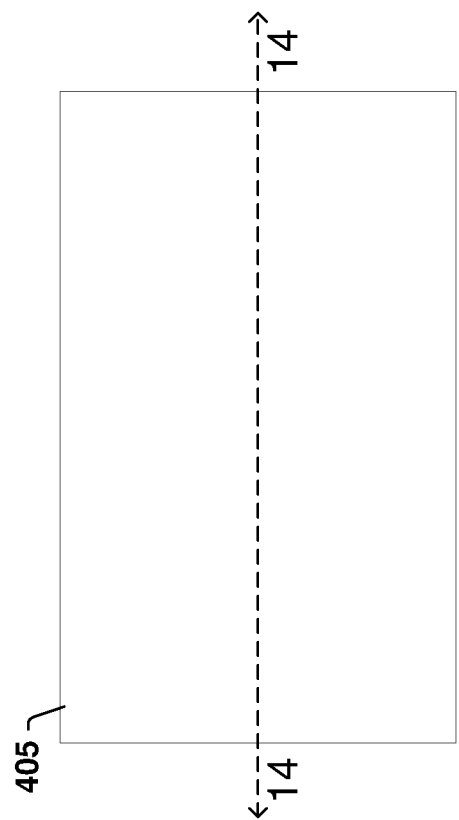
FIG. 14B is a top illustration of a semiconductor arrangement at a stage of fabrication, in accordance with one or more embodiments, where
Figure 14A:
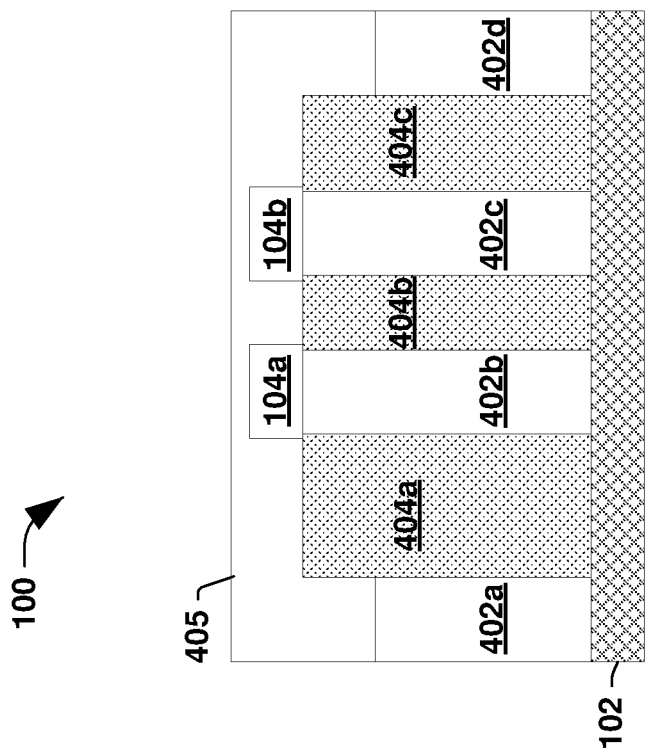
FIG. 14A is a cross sectional illustration of a semiconductor arrangement at a stage of fabrication, in accordance with one or more embodiments.

Referring to FIG. 14A and FIG. 14B, where FIG. 14A is a cross sectional view taken along line 14-14 of FIG. 14B, the portions 106a, 106b, 106c, 106d of the metal layer 106 are removed, such as by at least one of CMP or other suitable techniques, and a conductive material 405 is formed over exposed features, elements, etc., according to some embodiments. In some embodiments, the conductive material 405 is metal such as copper or other suitable materials. According to some embodiments, the conductive material 405 is formed by at least one of PVD, sputtering, CVD, LPCVD, ALCVD, UHVCVD, RPCVD, MBE, LPE, or other suitable techniques. According to some embodiments, the conducive material 405 serves to electrically connect some conductive features, elements, etc.

Figure 15:
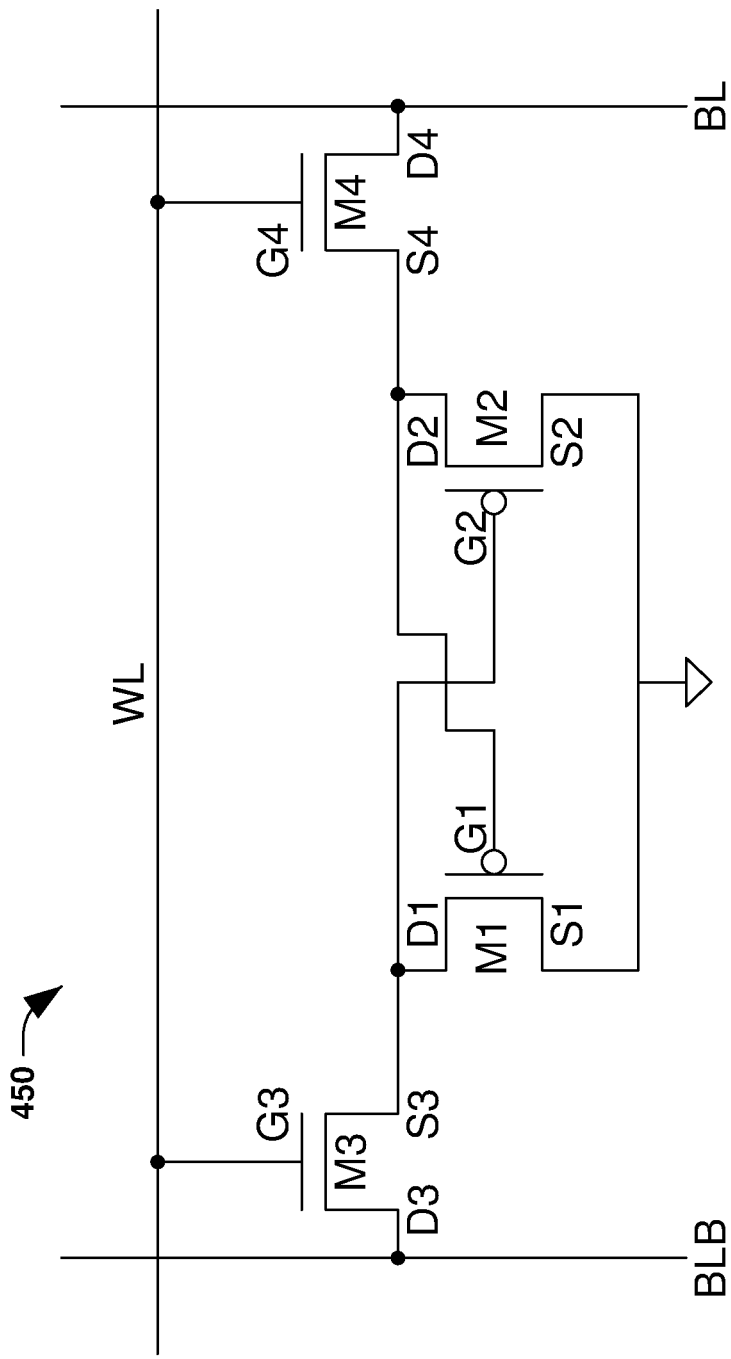
FIG. 15 is an illustration of a circuit schematic, in accordance with one or more embodiments.

By way of example, and not limitation, FIG. 15 is a schematic of a static random-access memory (SRAM) circuit 450. The circuit 450 comprises four transistors M1, M2, M4, M4. Gate G3 of transistor M3 and gate G4 of transistor M4 are connected to a word line (WL). Gate G1 of transistor M1 is connected to drain D2 of transistor M2 and source S4 of transistor M4. Gate G2 of transistor M2 is connected to drain D1 of transistor M1 and source S3 of transistor M3. Drain D3 of transistor M3 is connected to bit line bar (BLB) and drain D4 of transistor M4 is connected to bit line (BL). Source S1 of transistor M1 is connected to source S2 of transistor M2.

According to some embodiments, the conductive material 405 depicted in FIG. 14A and FIG. 14B makes at least one of the connection between drain D1 of transistor M1 and source S3 of transistor M3, the connection between drain D2 of transistor M2 and source S4 of transistor M4, or the connection between source S1 of transistor M1 and source S2 of transistor M2. According to some embodiments, the conductive material 405 depicted in FIG. 14A and FIG. 14B that makes such connections is, at times, referred to as a metal drain (MD).

FIG. 14A and FIG. 14B illustrate that the conductive material 405 also electrically couples conductive features 404a, 404b, 404c to one another. In some embodiments, it is desirable to decouple or electrically isolate some conductive features from one another, such as 404a, 404b, 404c.

Accordingly, referring to FIG. 16A and FIG. 16B, where FIG. 16A is a cross sectional view taken along line 16-16 of FIG. 16B, some of the conductive material 405, as well as remaining portions 104a, 104b of the first dielectric layer 104 are removed, according to some embodiments. In some embodiments, such removal occurs by way of at least one of CMP or other suitable techniques. Given that the conductive material 405 is, at times, referred to as a metal drain, removal of some of the conductive material 405 to decouple a conductive feature from one or more other conductive features is, at times, referred to as cut metal drain (CMD). As illustrated in FIG. 16B some of the conductive material 405 remains to electrically couple certain features, such as D1 to S3, D2 to S4, and S1 to S2 in the circuit 450 in FIG. 15, according to some embodiments. According to some embodiments, portions 405a1, 405a2, 405a3, 405b1, 405b2, 405b3, 405b4, 405c1, 405c2, 405c3, 405c4, 405d1, 405d2, 405d3 of the conductive material 405 remain. According to some embodiments, portion 405a2 couples epitaxy regions 410a1 and 410a2 (FIG. 13B) to one another. According to some embodiments, portion 405d2 couples epitaxy regions 410d1 and 410d2 (FIG. 12B) to one another.

According to some embodiments, removal of some of the conductive material 405 and remaining portions of the first dielectric layer 104 exposes portions 404a1, 404a2, 404a3, 404b1, 404b2, 404c1, 404c2, and 404c3 of the conductive features. According to some embodiments, removal of some of the conductive material 405 and remaining portions of the first dielectric layer 104 exposes portions 402a1, 402a2, 402b1, 402b2, 402b3, 402c1, 402c2, 402c3, 402d1, and 402d2 of the dielectric features. According to some embodiments, the aforementioned substantially vertical sidewalls serve to develop features, elements, etc. that have desired dimensions. By way of example, and not limitation, dimensions of 402a1 are sufficient to electrically isolate 405a1 from 405a2. The same is true for the dimensions of at least one of 402a2, 402b1, 402b2, 402b3, 402c1, 402c2, 402c3, 402d1, or 402d2 so as to be able to electrically isolate or cut conductivity between adjacent or surrounding items, such as at least two of 405a1, 405a2, 405a3, 405b1, 405b2, 405b3, 405b4, 405c1, 405c2, 405c3, 405c4, 405d1, 405d2, or 405d3, according to some embodiments.

Some embodiments described herein relate to fabricating a semiconductor arrangement. In accordance with some embodiments, the fabrication includes forming a first semiconductive layer over a first dielectric layer, patterning the first semiconductive layer to form a patterned first semiconductive layer, and patterning the first dielectric layer using the patterned first semiconductive layer to form a patterned first dielectric layer. The pattern formed in the patterned first dielectric layer is transferred to one or more underlying layers in some embodiments. According to some embodiments, a negative of the pattern formed in the patterned first dielectric layer is transferred to one or more underlying layers. According to some embodiments, the fabrication produces recesses defined by substantially vertical sidewalls. Features, elements, etc. formed in the recesses thus have substantially vertical or smooth sidewalls or profiles.

According to some embodiments, a method for fabricating a semiconductor arrangement is provided that includes forming a first dielectric layer, forming a first semiconductive layer over the first dielectric layer, patterning the first semiconductive layer to form a patterned first semiconductive layer, patterning the first dielectric layer using the patterned first semiconductive layer to form a patterned first dielectric layer, and forming a second semiconductive layer over the patterned first dielectric layer and the patterned first semiconductive layer.

According to some embodiments, a method for fabricating a semiconductor arrangement is provided that includes forming a silicon nitride layer, forming a silicon layer over the silicon nitride layer, and patterning the silicon layer to form a recess in the silicon nitride layer and a patterned silicon layer comprising a first silicon structure and a second silicon structure.

According to some embodiments, a method for fabricating a semiconductor arrangement is provided that includes forming a first dielectric layer over an oxide layer, forming a first semiconductive layer over the first dielectric layer, performing a first etch to form a first semiconductive structure and a second semiconductive structure from the first semiconductive layer, and performing a second etch to change a cross-sectional profile of the first semiconductive structure, where at least one of the first etch or the second etch forms a recess in the first dielectric layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for fabricating a semiconductor arrangement, comprising:
   forming a first dielectric layer;
   forming a first semiconductive layer over the first dielectric layer;
   forming a photoresist layer over the first semiconductive layer;
   patterning the first semiconductive layer using the photoresist layer to form a patterned first semiconductive layer, wherein a first portion of the first dielectric layer is exposed through the patterned first semiconductive layer;
   forming a second photoresist layer over the patterned first semiconductive layer, wherein a second portion of the first dielectric layer is exposed through the second photoresist layer, the second portion of the first dielectric layer being a portion of but less than all of the first portion of the first dielectric layer; and
   recessing the second portion of the first dielectric layer using the second photoresist layer.

2. The method of claim 1, wherein a first portion of the patterned first semiconductive layer is exposed through the second photoresist layer.

3. The method of claim 2, comprising:
   removing the first portion of the patterned first semiconductive layer to expose a third portion of the first dielectric layer.

4. The method of claim 3, wherein removing the first portion of the patterned first semiconductive layer comprises removing the first portion of the patterned first semiconductive layer concurrently with recessing the second portion of the first dielectric layer.

5. The method of claim 3, comprising:
   removing the second portion of the first dielectric layer and the third portion of the first dielectric layer to expose a first portion of a second dielectric layer under the first dielectric layer.

6. The method of claim 1, comprising:
   removing the second portion of the first dielectric layer to expose a first portion of a second dielectric layer under the first dielectric layer after recessing the second portion of the first dielectric layer.

7. The method of claim 6, comprising:
   forming a third dielectric layer along a sidewall of the patterned first semiconductive layer and along a sidewall of the first dielectric layer.

8. The method of claim 7, comprising:
   forming a second semiconductive layer over the first portion of the second dielectric layer, wherein the sidewall of the patterned first semiconductive layer and the sidewall of the first dielectric layer are separated from the second semiconductive layer by the third dielectric layer.

9. The method of claim 6, comprising:
forming a second semiconductive layer over the first portion of the second dielectric layer; and
patterning the second dielectric layer using the second semiconductive layer to form a patterned second dielectric layer.

10. The method of claim 9, comprising:
patterning a third dielectric layer under the second dielectric layer using the second semiconductive layer.

11. The method of claim 9, comprising:
patterning a metal layer under the second dielectric layer using the second semiconductive layer.

12. A method for fabricating a semiconductor arrangement, comprising:
forming a first semiconductive layer;
patterning the first semiconductive layer to form a patterned first semiconductive layer;
forming a first dielectric layer over the patterned first semiconductive layer; and
forming a second semiconductive layer over the first dielectric layer, wherein a sidewall of the second semiconductive layer is spaced apart from a sidewall of the patterned first semiconductive layer by the first dielectric layer.

13. The method of claim 12, comprising:
removing the patterned first semiconductive layer after forming the second semiconductive layer.

14. The method of claim 12, comprising:
removing the first dielectric layer to expose the sidewall of the second semiconductive layer.

15. The method of claim 12, comprising:
patterning a metal layer under the second semiconductive layer using the second semiconductive layer.

16. The method of claim 15, comprising:
patterning a second dielectric layer under the metal layer using the metal layer.

17. The method of claim 16, comprising:
forming a conductive metal over the second dielectric layer after patterning the second dielectric layer.

18. A method for fabricating a semiconductor arrangement, comprising:
forming a first dielectric layer over an oxide layer;
forming a first semiconductive layer over the first dielectric layer;
performing a first etch to form a first semiconductive structure and a second semiconductive structure from the first semiconductive layer; and
performing a second etch to recess the first dielectric layer between the first semiconductive structure and the second semiconductive structure and remove a portion of the second semiconductive structure.

19. The method of claim 18, comprising:
forming a photoresist over the first semiconductive structure and a portion of the second semiconductive structure before performing the second etch.

20. The method of claim 18, comprising:
forming a second semiconductive layer over the first semiconductive layer after performing the second etch.

* * * * *